(12) United States Patent
Ikhlef et al.

(10) Patent No.: US 8,552,466 B2
(45) Date of Patent: Oct. 8, 2013

(54) LOW CAPACITANCE PHOTODIODE ELEMENT AND COMPUTED TOMOGRAPHY DETECTOR

(75) Inventors: Abdelaziz Ikhlef, Hartland, WI (US); Wen Li, Clifton Park, NY (US); Jeffrey Alan Kautzer, Pewaukee, WI (US)

(73) Assignee: General Electric Company, Schenectady, NY (US)

( * ) Notice: Subject to any disclaimer, the term of this patent is extended or adjusted under 35 U.S.C. 154(b) by 577 days.

(21) Appl. No.: 12/434,947

(22) Filed: May 4, 2009

(65) Prior Publication Data
US 2010/0276777 A1    Nov. 4, 2010

(51) Int. Cl.
*H01L 31/101* (2006.01)
(52) U.S. Cl.
USPC ............ 257/115; 257/458; 257/E31.061
(58) Field of Classification Search
USPC .......... 257/115, 431, 436–43, 443, 446, 257/464, 458
See application file for complete search history.

(56) References Cited

U.S. PATENT DOCUMENTS

| | | | | |
|---|---|---|---|---|
| 5,252,852 A | * | 10/1993 | Makiuchi et al. | 257/458 |
| 5,587,611 A | * | 12/1996 | Botka et al. | 257/458 |
| 5,796,153 A | * | 8/1998 | Marcovici | 257/446 |
| 6,201,234 B1 | * | 3/2001 | Chow et al. | 250/214 LS |
| 6,393,092 B1 | * | 5/2002 | Yoshida | 378/19 |
| 6,753,214 B1 | * | 6/2004 | Brinkmann et al. | 438/184 |
| 7,161,155 B1 | * | 1/2007 | Deych | 250/370.11 |
| 2003/0122083 A1 | * | 7/2003 | Possin et al. | 250/370.11 |
| 2006/0289777 A1 | * | 12/2006 | Li et al. | 250/370.14 |
| 2007/0272872 A1 | * | 11/2007 | Joshkin et al. | 250/370.11 |

* cited by examiner

*Primary Examiner* — Ahmed Sefer

(57) ABSTRACT

A photodiode element includes a first layer of a first diffusion type and a second layer. The second layer defines a charge-collecting area. The charge-collecting area includes an active region of a second diffusion type and an inactive region. The active region surrounds the inactive region. The photodiode element also includes an intrinsic semiconductor layer between the first layer and the second layer.

11 Claims, 3 Drawing Sheets

LOW CAPACITANCE PHOTODIODE ELEMENT AND COMPUTED TOMOGRAPHY DETECTOR

FIELD OF THE INVENTION

This disclosure relates generally to the field of photodiode elements and photodiode arrays.

BACKGROUND OF THE INVENTION

Most conventional computed tomography (CT) systems use a detector that includes a scintillator and a photodiode array. The scintillator converts x-ray photons into photons of visible light and the photodiode array converts the photon of visible light into an electric signal current. The integrated charge of the electric signal current produced by the photodiode array is proportional to the energy of the x-ray photon captured by the scintillator.

Typically, the photodiode array used in a computed tomography detector includes a plurality of photodiode elements in an arrangement such as 16×16, 16×32, 16×64, and 24×64. The photodiode array is typically coupled to a scintillator array. Each photodiode element of the photodiode array is generally about 1 mm wide and 1 mm long. This typically results in a capacitance in the range of approximately 10 pF to 15 pF per photodiode element.

In order to produce images with high temporal resolution, there is a constant pressure to increase the speed at which a CT system acquires data. Additionally, in the interest of patient safety, there is a desire to reduce the amount of x-ray photons needed to produce a clinically useful image. Reducing the noise produced by the detector may help to both increase the speed of acquisition and lower the x-ray dose needed to produce a satisfactory image. One of the significant contributors to image noise is the electronic noise generated by the detector. One way to reduce the electronic noise contributed by the detector is to reduce the capacitance of each photodiode element in the photodiode array.

Thus, in order to reduce electronic noise, there is a need to develop a lower capacitance photodiode element and a lower capacitance photodiode array without compromising the response time of each photodiode element.

BRIEF DESCRIPTION OF THE INVENTION

The above-mentioned shortcomings, disadvantages and problems are addressed herein which will be understood by reading and understanding the following specification.

In an embodiment, a photodiode element includes a first layer with a first diffusion type and a second layer. The second layer defines a charge-collecting area that includes an active region of a second diffusion type and an inactive region. The active region surrounds the inactive region. The photodiode also includes an intrinsic semiconductor layer between the first layer and the second layer.

In an embodiment, a photodiode element includes a first layer with a first diffusion type and a second layer defining a charge-collecting area. The charge-collecting area includes a plurality of active regions of a second diffusion type and an inactive region. The plurality of active regions are electrically interconnected. The photodiode also includes an intrinsic semiconductor layer between the first layer and the second layer.

In an embodiment, a computed tomography detector includes a scintillator for converting x-rays into visible light. The computed tomography detector also includes a photodiode array positioned to receive visible light from the scintillator. The photodiode array includes a plurality of photodiode elements. Each of the plurality of photodiode elements includes a first layer with a first diffusion type and a second layer. The second layer defines a charge-collecting area. The charge-collecting area includes an active region of a second diffusion type and a plurality of inactive regions. The active region surrounds the plurality of inactive regions. Each of the plurality of photodiode elements also includes an intrinsic semiconductor layer disposed between the first layer and the second layer.

Various other features, objects, and advantages of the invention will be made apparent to those skilled in the art from the accompanying drawings and detailed description thereof.

DETAILED DESCRIPTION OF THE INVENTION

In the following detailed description, reference is made to the accompanying drawings that form a part hereof, and in which is shown by way of illustration specific embodiments that may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken as limiting the scope of the invention.

Figure 1:
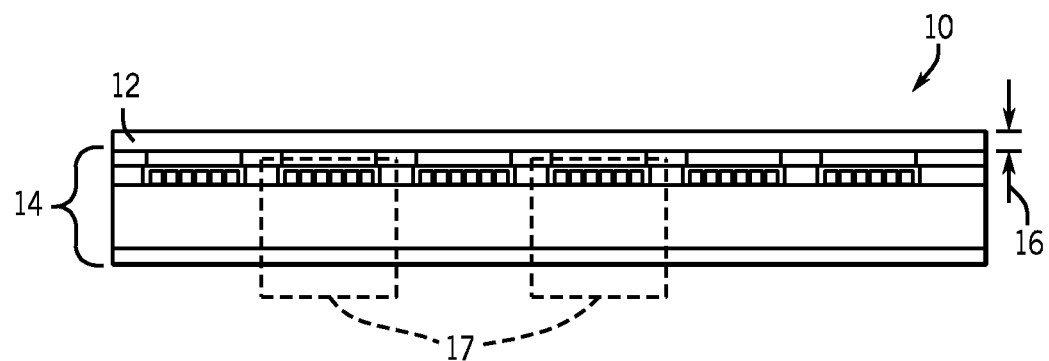
FIG. 1 is a schematic representation of a cross-section of a computed tomography detector in accordance with an embodiment.

Referring to FIG. 1, a schematic representation of a cross-section of a computed tomography detector 10 is shown in accordance with an embodiment. The computed tomography detector 10 includes a scintillator array 12 and a photodiode array 14. The scintillator array 12 is designed to convert x-rays photons into photons of visible light. The scintillator array 12 may comprise a material formed from garnet crystals combined with a rare earth phosphor. Other embodiments may use different materials for the scintillator array 12, such as gadolinium oxysulfide. The scintillator array 12 may comprise a layer that is approximately 1 mm to 5 mm thick, as indicated by dimension 16. It should be appreciated by those skilled in the art that the thickness of the scintillator array 12 may be outside of this range according to other embodiments. The thickness of the scintillator array 12 will depend on the material selected for the scintillator array 12 as well as the expected energy level of the x-ray photons that the scintillator array 12 will be expected to convert into photons of visible light.

The photodiode array 14 includes a plurality of photodiode elements 17. The cross-sections of six photodiode elements 17 are schematically represented in FIG. 1. It should be appreciated by those skilled in the art that a photodiode array used in a computed tomography detector may comprise significantly more than six photodiodes.

Figure 2:
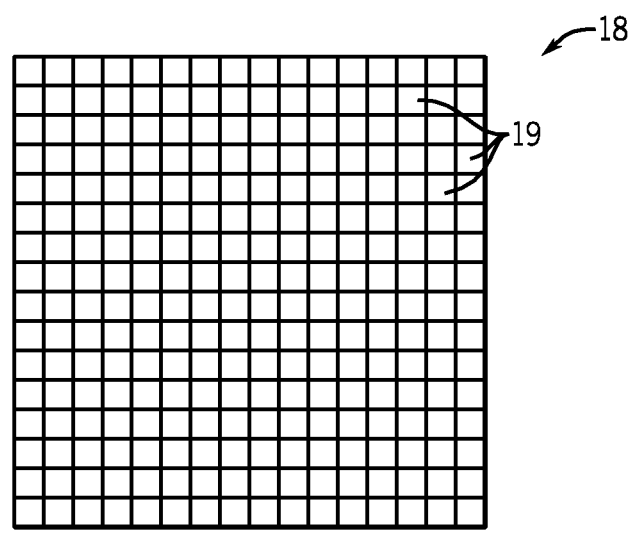
FIG. 2 is a schematic representation of a photodiode array in accordance with an embodiment.

Referring to FIG. 2, a schematic representation of a photodiode array 18 is shown. The photodiode array 18 includes a plurality of photodiode elements 19. The photodiode array 18 comprises a 16×16 array of photodiode elements 19. Each of the photodiode elements 19 is capable of generating a signal in response to detecting light. The size of the photodiode elements 19 limits the maximum resolution of the photodiode array 18. For this reason, the photodiode elements 19 are sometimes referred to as pixels or cells by those skilled in the art.

According to an embodiment, each photodiode array may be configured as part of a separate detector module. According to an exemplary embodiment, each photodiode array in detector module may comprise 16 photodiode elements in a x-direction and 64 photodiode elements in a z-direction. It should be appreciated that photodiode arrays may have different numbers of photodiode elements in either the x-direction and/or the z-direction according to additional embodiments.

Figure 3:
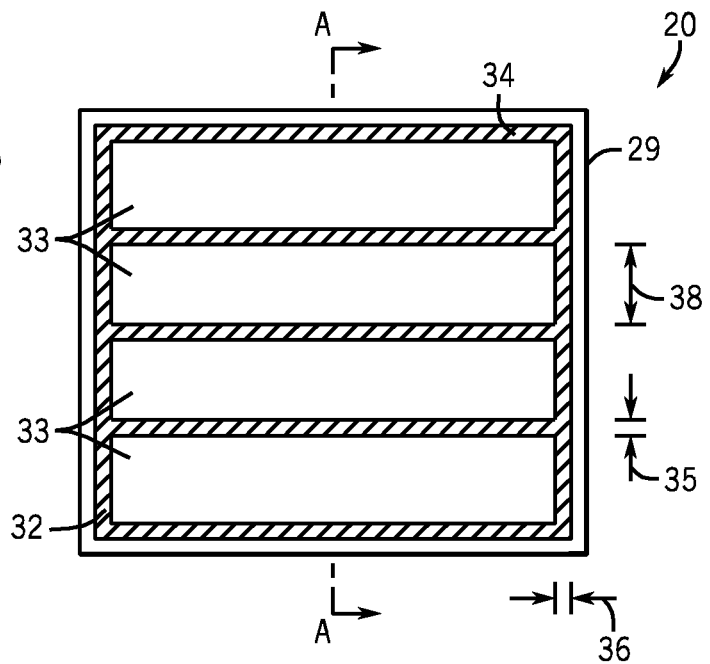
FIG. 3 is a schematic representation of a photodiode element in accordance with an embodiment.
Figure 4:
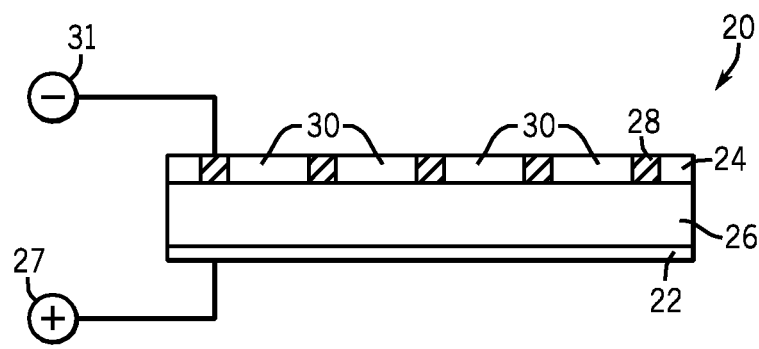
FIG. 4 is a schematic representation of a cross-section of a photodiode element in accordance with an embodiment.

Referring to FIG. 3, a schematic representation of a photodiode element 20 is shown in accordance with an embodiment. Referring to FIG. 4, a schematic representation of a cross-sectional view of the photodiode element 20 from FIG. 3 along sectional line A-A is shown in accordance with an embodiment. Common reference numbers will be used to identify structures that appear in both FIG. 3 and FIG. 4.

Referring to both FIG. 3 and FIG. 4, the photodiode element 20 includes a first layer 22, a second layer 24, and an intrinsic semiconductor layer 26. The first layer 22 is made of a doped silicon semiconductor with an N+ diffusion. For the purposes of this disclosure, the term N+ diffusion is defined to include semiconductor materials with a surplus of free electrons. The first layer 22 is less than 0.5 µm in thickness and attached to a cathode 27 according to an embodiment. The intrinsic semiconductor layer 26 may comprise silicon or other materials that are intrinsic semiconductors. The second layer 24 may be less than 10 µm in thickness according to an embodiment. According to one embodiment, the second layer 24 may be between 2 µm and 5 µm in thickness. The second layer 24 includes an active volume 28 and a plurality of inactive volumes 30. The active volume 28 may comprise a doped silicon semiconductor with a P+ diffusion. For the purposes of this disclosure, the term P+ diffusion is defined to include semiconductor materials with a surplus of holes. The active volume 28 is connected to an anode 31. Each of the plurality of inactive volumes 30 may comprise an undoped semiconductor. The plurality of inactive volumes 30 may comprise the same material as the intrinsic semiconductor layer 26. For the purposes of this disclosure, the thickness of the second layer 24 may be determined by the thickness of the active volume 28. For example, referring to FIG. 3, the thickness of the second layer 24 is defined by the thickness of the active volume 28, which is approximately 3 µm according to an embodiment.

The second layer 24 defines a charge-collecting area 29. According to an embodiment, FIG. 3 is a representation of the charge-collecting area 29 of the photodiode element 20. For the purposes of this disclosure, the term "charge-collecting area" is defined to include an area of a photodiode element that is designed to collect charge carriers generated by incoming photons of light hitting the photodiode element. For example, if photons of light hit the photodiode element 20 within the charge-collecting area 29, the photodiode element 20 is designed to detect the photons of light as a photocurrent.

The active volume 28 defines an active region 32 within the charge collecting area 29. The plurality of inactive volumes 30 defines a plurality of inactive regions 33 within the charge-collecting area 29. The photodiode element 20 may be formed by doping an intrinsic semiconductor to form the first layer 22 and the second layer 24. According to an embodiment, during the doping process, the plurality of inactive regions 33 are masked off and only the active volume 28 is doped to attain a P+ diffusion. The active volume 28 has a generally uniform cross-section at different depths within the second layer 24 as shown in FIG. 4.

According to the embodiment shown in FIGS. 3 and 4, the active region 32 may comprise a grid 34. The grid 34 includes four rungs that are connected to each other by two side pieces. The grid 34 surrounds the plurality of inactive regions 33. For the purposes of this disclosure, the term grid is defined to include a pattern comprising a first set of generally parallel lines running in a first direction intersecting with a second set of generally parallel lines running in a second direction. Each of the four rungs on the grid 34 is 44 µm wide as shown by a dimension 35 and the rungs are connected by a side piece that is also 44 µm wide as shown by a dimension 36. Each of the four rungs is separated by 200 µm as shown by a dimension 38. It should be appreciated by those skilled in the art that other embodiments could have an active region shaped as a grid with different dimensions than the embodiment shown in FIGS. 3 and 4. Additionally, other embodiments may have active regions that are not shaped as a grid. Some constraints affecting the shape and dimensions of the active region 32 will be discussed hereinafter.

Photodiode elements work by converting photons of light into a photocurrent that can be measured. When a photon of light is absorbed in the intrinsic semiconductor layer 26, the photodiode 20 creates a free electron and a hole. Still referring to FIGS. 3 and 4, the hole diffuses toward the anode 31, where the hole is collected. Meanwhile, the free electron diffuses toward the cathode 27, where the electron is collected. As was previously described, the anode 31 is electrically coupled to the active volume 28 and the cathode 27 is electrically coupled to the first layer 22. The movement of free electrons and holes creates a photocurrent which is proportional to the flux of light absorbed in the photodiode and thus to the x-ray intensity absorbed in the scintillator. The energy level and/or number of photons absorbed by the photodiode may be determined based on the photocurrent. According to an embodiment, the first layer 22 is a doped semiconductor with an N+ diffusion. The N+ diffusion means that the material in the first layer 22 has more free electrons than holes. The active volume 28 of the second layer 24 comprises a doped semiconductor with a P+ diffusion. The second layer 24 also comprises the plurality of inactive volumes 30. In order to ensure that the second layer 24 maintains its charge-collecting ability, it is important that no point within each of the plurality of inactive regions 33 is too far from the active region 32. As long as all the points in each of the plurality of inactive regions 33 is within a carrier diffusion length of the active region 32, electrons moving towards the anode 31 will be attracted to the nearest portion of the active region 32 and the charge-collecting ability of the photodiode will be approximately the same as if the whole charge-collecting area 29 comprised an active region with a P+ diffusion.

Still referring to FIGS. 3 and 4, the holes take time to travel through the semiconductor in order to get collected at the anode. By limiting the thickness of the intrinsic semiconductor layer 26 and also putting constraints on the size of the inactive regions 33, it is possible to design a photodiode element with a reasonable response time. For example, according to an embodiment, it is desirable to have a response time of around 10 μS for a photodiode element designed to be used in a computed tomography detector. Experimental results have shown that it takes approximately 10 μS or less for holes to diffuse across a 200 μm gap in a silicon semiconductor. Therefore, if it is desirable to have a 10 μS response time, it is important that a shortest carrier diffusion distance is 200 μm or less for each of the plurality of inactive regions. For purposes of this disclosure, the term "shortest carrier diffusion distance" is defined to include the shortest straight-line path from any point in an inactive region to an active region. Therefore, if the shortest carrier diffusion distance is 200 μm for an inactive region, then all points within the inactive region are within 200 μm of an active region. It should be appreciated by those skilled in the art that it may be desirable to have a response time significantly quicker than 10 μS. In order to design a photodiode element with a response time of less than 10 μS, the shortest carrier diffusion distance would have to be a smaller value than 200 μm. Likewise, if a photodiode does not need as quick of a response time, it would be possible to have an bigger inactive region where some points within the inactive region are more than 200 μm away from the nearest portion of an active region.

Still referring to the embodiment shown in FIGS. 3 and 4, each of the plurality of inactive regions 33 are surrounded by the active region 32. Each of the plurality of inactive volumes 30 extends all the way through the second layer 24. With respect to the embodiment shown in FIG. 3 and FIG. 4, each of the plurality of inactive regions 33 are surrounded by the active region 32. It should be appreciated by those skilled in the art that other embodiments may have inactive regions with a considerably different shape than that shown in FIG. 3. Additionally, other embodiments may comprise a different number of inactive regions.

Figure 5:
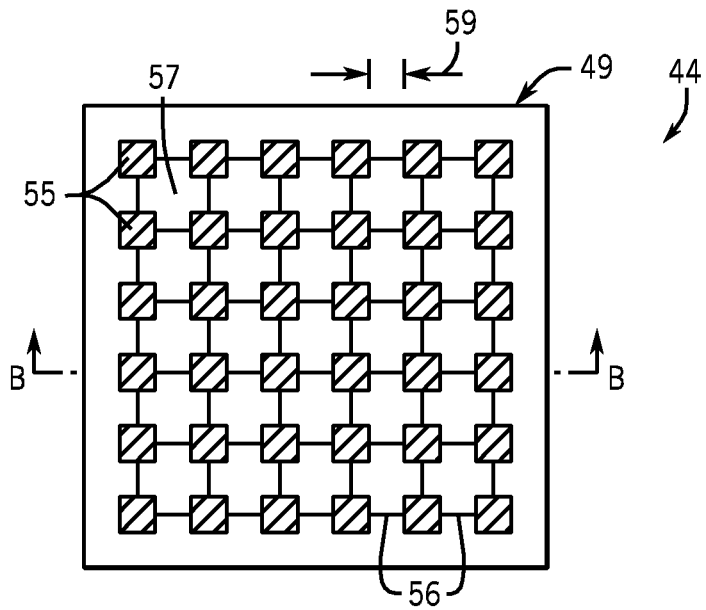
FIG. 5 is a schematic representation of a photodiode element in accordance with an embodiment.
Figure 6:
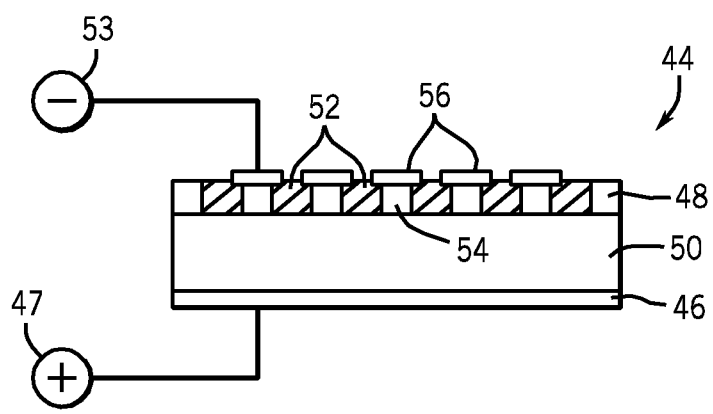
FIG. 6 is a schematic representation of a cross-section of a photodiode element in accordance with an embodiment.

Referring to FIG. 5, a schematic representation of a photodiode element 44 is shown in accordance with an embodiment. Referring to FIG. 6, a schematic representation of a cross-section of the photodiode element 44 is shown along sectional line B-B. Common reference numbers will be used to identify structures that appear in both FIG. 5 and FIG. 6. Elements that are substantially the same as those previously described with respect to FIGS. 3 and 4 may not be described in detail with respect to FIGS. 5 and 6.

Referring to both FIG. 5 and FIG. 6, the photodiode element 44 includes a first layer 46, a second layer 48 and an intrinsic semiconductor layer 50. The first layer 46 is made of a doped semiconductor with an N+ diffusion. The first layer is connected to a cathode 47. The second layer 48 comprises a plurality of active volumes 52 and an inactive volume 54. In other embodiments, a second layer may comprise both a plurality of active volumes and a plurality of inactive volumes. Each of the plurality of active volumes 52 comprises a doped semiconductor with a P+ diffusion. The plurality of active volumes 52 are electrically interconnected, and the plurality of active volumes 52 are connected to an anode 53. A plurality of conductive contacts 56 may be used to electrically interconnect the plurality of active elements 52. According to an embodiment, the plurality of conductive contacts may comprise metal contacts. According to other embodiments, two or more active volumes may also be electrically interconnected by a diffusion line of the same diffusion type as the active volumes. The diffusion line may be significantly thinner than the thickness of the first layer according to an embodiment.

The second layer 48 defines a charge-collecting area 49. According to an embodiment, FIG. 5 is a representation of the charge-collecting area 49 of the photodiode element 44. The plurality of active volumes 52 define a plurality of active regions 55 and the inactive volume 54 defines an inactive region 57 within the charge-collecting area 49. The photodiode element 44 may be formed by doping an intrinsic semiconductor to form the first layer 46 and the second layer 48.

According to an embodiment, each of the plurality of active regions 55 may be evenly spaced apart to form an array of active regions. Each of the plurality of active regions 55 may be approximately 80 μm wide by 80 μm long. Each of the active regions 55 may be separated by a dimension 59. According to an embodiment, the dimension 59 separating the active regions may be approximately 100 μm. According to another embodiment, the dimension 59 separating the active regions may be approximately 200 μm. Other embodiments may have the active regions 55 arranged in a different fashion.

The capacitance of a photodiode element depends on both a total area of the active region/s and on the total perimeter length of the boundary between the active region/s and the inactive region/s. The following equation may be used to estimate the contribution of the total area of the active region/s to the capacitance C1:

$$C1(ND, NA) = A \cdot \sqrt{\frac{e \cdot \varepsilon \cdot \varepsilon_0 \cdot ND}{2\left[V_e(ND, NA) + \frac{KT}{e}\left(1 - \ln\left(\frac{NA}{ND}\right)\right)\right]}}$$

where ND is an intrinsic doping density of the semiconductor; NA is a P+ doping density; A is the total area of the active region/s; $V_e(ND, NA)$ is a built-in voltage of a PN junction; K is the Boltzmann; T is temperature; $\in$ is the dielectric constant of silicon; $\in_0$ is the free space permittivity; and $\in$ is the unit charge of an electron.

Additionally, the following equation may be used to estimate the contribution of the perimeter length of the active region/s to the capacitance C2:

$$C2 = C_P^*(P_T)$$

where $C_P$ is the capacitance coefficient and $P_T$ is the total length of the perimeter of the active region/s.

Based on the equations above, in order to minimize the capacitance of a photodiode element for a given charge-collecting area, it is desirable to minimize the area of the active regions while also minimizing the perimeter of the active region/regions. The exact shapes chosen for the active region/s and the inactive region/s may be optimized in part by using the two equations above. It should be understood by those skilled in the art that other factors, such as the desired response time, may also be taken into consideration for the final design of the active region/s and the inactive region/s of the photodiode.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A photodiode element comprising:
   a first layer comprising a first diffusion type;
   a second layer defining a charge-collecting area, said charge-collecting area comprising an active region of a second diffusion type and an inactive region, wherein the active region comprises a grid with three or more parallel rungs running in a first direction that are intersected by at least two parallel rungs running in a second direction; and
   an intrinsic semiconductor layer disposed between the first layer and the second layer.

2. The photodiode element of claim 1, wherein the first diffusion type comprises a P+ diffusion.

3. The photodiode element of claim 2, wherein the second diffusion type comprises an N+ diffusion.

4. The photodiode element of claim 1, wherein the first diffusion type comprises an N+ diffusion.

5. The photodiode element of claim 4, wherein the second diffusion type comprises a P+ diffusion.

6. The photodiode element of claim 1, wherein a dimension of the inactive region is determined by a shortest carrier diffusion distance, wherein the shortest carrier diffusion distance comprises 200 um or less.

7. The photodiode element of claim 1, wherein the inactive region surrounds the active region.

8. The photodiode element of claim 1, wherein each of the three or more parallel rungs are separated by 200 μm or less.

9. A computed tomography detector comprising:
   a scintillator array for converting x-rays into visible light; and
   a photodiode array positioned to receive visible light from the scintillator, said photodiode array comprising a plurality of photodiode elements, each of said plurality of photodiode elements comprising:
   a first layer comprising a first diffusion type;
   a second layer defining a charge-collecting area, said charge-collecting area comprising an active region of a second diffusion type and a plurality of inactive regions, wherein the active region comprises a grid, the grid comprising four rungs that are each connected to both of two side pieces, wherein the rungs are generally perpendicular to the side pieces; and
   an intrinsic semiconductor layer disposed between the first layer and the second layer.

10. The computed tomography detector of claim 9, wherein each of the plurality of inactive regions comprises an intrinsic semiconductor.

11. The computed tomography detector of claim 9, wherein at least one of the plurality of the inactive regions surrounds the active region.

* * * * *